(12) United States Patent
Kim et al.

(10) Patent No.: US 9,475,094 B2
(45) Date of Patent: Oct. 25, 2016

(54) VIBRATION GENERATING APPARATUS

(71) Applicant: SAMSUNG ELECTRO-MECHANICS CO., LTD., Suwon-si (KR)

(72) Inventors: Jae Kyung Kim, Suwon-si (KR); Yeon Ho Son, Suwon-si (KR); Sang Jin Lee, Suwon-si (KR); Dong Su Moon, Suwon-si (KR); Hwa Young Oh, Suwon-si (KR)

(73) Assignee: MPLUS CO., LTD., Suwon-Si, Gyeonggi-Do (KR)

( * ) Notice: Subject to any disclaimer, the term of this patent is extended or adjusted under 35 U.S.C. 154(b) by 271 days.

(21) Appl. No.: 14/199,937

(22) Filed: Mar. 6, 2014

(65) Prior Publication Data

US 2014/0285064 A1    Sep. 25, 2014

Related U.S. Application Data

(60) Provisional application No. 61/803,602, filed on Mar. 20, 2013.

(30) Foreign Application Priority Data

Nov. 13, 2013    (KR) .................. 10-2013-0137516

(51) Int. Cl.
*H01L 41/09* (2006.01)
*B06B 1/14* (2006.01)
*B06B 1/06* (2006.01)

(52) U.S. Cl.
CPC .............. *B06B 1/14* (2013.01); *B06B 1/0644* (2013.01)

(58) Field of Classification Search
USPC ....................................................... 310/348
See application file for complete search history.

(56) References Cited

U.S. PATENT DOCUMENTS

2005/0023937 A1   2/2005  Sashida et al.
2011/0193646 A1*  8/2011  Sugama ............... H03H 9/1021
                                                     331/158

(Continued)

FOREIGN PATENT DOCUMENTS

CN    202123052    1/2012
EP    1 501 074    1/2005

(Continued)

OTHER PUBLICATIONS

Office Action dated Nov. 30, 2015 for Chinese Patent Application No. 201410103461.1 and its English summary provided by Applicant's foreign counsel.

(Continued)

*Primary Examiner* — Thomas Dougherty
(74) *Attorney, Agent, or Firm* — LRK Patent Law Firm

(57) ABSTRACT

There is provided a vibration generating apparatus including a vibration transferring member transferring vibrations to outside the vibration generating apparatus, an elastic member having one or more end portions fixed to the vibration transferring member, a mass body vibrating in response to vibrations of the elastic member, and a piezoelectric element installed on one surface of the elastic member so as to be disposed to face the mass body. A lower surface of the mass body has step parts in order to prevent contact between the mass body and the piezoelectric element. The lower surface of the mass body in which the step parts are formed and the piezoelectric element are disposed so as to be spaced apart from each other by a predetermined distance.

22 Claims, 10 Drawing Sheets

(56) References Cited

U.S. PATENT DOCUMENTS

| | | |
|---|---|---|
| 2012/0212100 A1 | 8/2012 | Lee |
| 2012/0299448 A1 | 11/2012 | Liu et al. |

FOREIGN PATENT DOCUMENTS

| | | |
|---|---|---|
| JP | 9-327654 | 12/1997 |
| JP | 2000-140759 | 5/2000 |
| JP | 2005-45691 | 2/2005 |
| JP | 2011-91719 | 5/2011 |
| JP | 2011-245437 | 12/2011 |
| KR | 10-2007-0019332 A | 2/2007 |
| KR | 10-2008-0042560 A | 5/2008 |
| KR | 10-2011-0045486 A | 5/2011 |
| KR | 10-1157868 | 6/2012 |

OTHER PUBLICATIONS

Office Action dated Jan. 20, 2015 for Japanese Patent Application No. 2014-041784 and its English summary provided by Applicant's foreign counsel.

Office Action dated Mar. 19, 2015 for Korean Patent Application No. 10-2013-0137516 and its English summary provided by Applicant's foreign counsel.

* cited by examiner

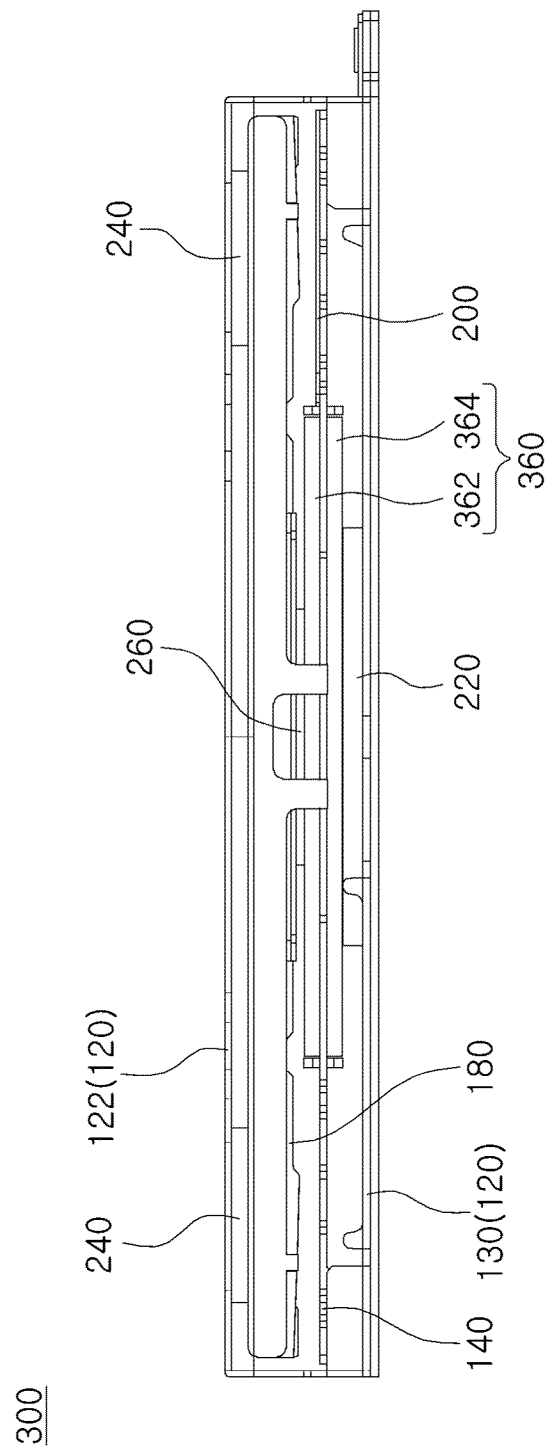

VIBRATION GENERATING APPARATUS

CROSS-REFERENCE TO RELATED APPLICATIONS

This application claims the benefits of U.S. Patent Application No. 61/803,602 filed on Mar. 20, 2013, with the United States Patent and Trademark Office, and Korean Patent Application No. 10-2013-0137516 filed on Nov. 13, 2013, with the Korean Intellectual Property Office, the disclosures of which are incorporated in their entireties herein by reference.

BACKGROUND

Unless otherwise indicated herein, the materials described in this section are not prior art to the claims herein and are not admitted to be prior art by inclusion in this section. Embodiments of the present disclosure generally relate to a vibration generating apparatus.

A vibration generating apparatus converts electrical energy into mechanical vibrations using the principle of electromagnetic force. The vibration generating apparatus may be mounted in, for example, mobile phones, and the like, to thereby be used for silently notifying a user of call reception by transferring vibrations. In accordance with the rapid growth in the market for mobile devices such as the mobile phones, and the like, and with the trend for the addition of functionality to mobile devices, such mobile devices may be relatively small and have high quality. The demand for development of a vibration generating apparatus having a new structure capable of overcoming disadvantages of existing vibration generating apparatuses and quality has been improved.

Further, as the release of smartphones, among other mobile phones has rapidly increased, a touchscreen scheme has been adopted for use therein, such that a vibration motor has been used in order to generate vibrations at the time a touchscreen is touched by a user. Examples of preferred performance of the vibrations associated with the touchscreen are as follows. First, since vibrations generated at the time a touchscreen is touched are generated frequently than vibrations generated at the time of call reception, an operational lifespan of a vibration generating apparatus may need to be increased. Second, in order to increase user satisfaction when a user feels vibrations when touching a touchscreen, a response speed of the vibrations may be increased in accordance with a touch speed of the touchscreen.

For example, a piezo haptic actuator may be used. Such a piezo haptic actuator may use a principle of an inverse piezoelectric effect in which displacement is generated when a voltage is applied to a piezo element, that is, a principle of allowing a weight of a mover to be moved by the generated displacement to generate vibrations.

The vibrator may have the following exemplary features. A bandwidth of a frequency capable of obtaining a predetermined level of vibrational force or more may be wide, such that stable vibration characteristics may be implemented. Vibrations having low and high frequencies rather than a single frequency in a predetermined frequency range may be variously used. In addition, since the vibrator may implement rapid operational response characteristics, haptic vibrations may be implemented in a mobile device such as a mobile phone, or the like.

RELATED ART DOCUMENT (Patent Document 1) Korean Patent Laid-Open Publication No. 2011-45486

SUMMARY

Some embodiments of the present disclosure may provide a vibration generating apparatus capable of preventing damage to a piezoelectric element.

According to some embodiments of the present disclosure, a vibration generating apparatus may include a vibration transferring member transferring vibrations to outside the vibration generating apparatus, an elastic member having one or more end portions fixed to the vibration transferring member, a mass body vibrating in response to vibrations of the elastic member, and a piezoelectric element installed on one surface of the elastic member so as to be disposed to face the mass body. A lower surface of the mass body may have step parts in order to prevent contact between the mass body and the piezoelectric element. The lower surface of the mass body in which the step parts are formed and the piezoelectric element may be disposed so as to be spaced apart from each other by a predetermined distance.

The mass body may have an inclined surface formed on the lower surface thereof, wherein the inclined surface is inclined upwardly from the step part of the mass body toward a distal end thereof.

The elastic member may include a bottom plate having both end portions fixed to the vibration transferring member.

The bottom plate may have one or more openings formed therein in order to expose an electrode formed on the piezoelectric element.

The bottom plate may have at least one elastic deformation assisting hole formed between the opening of the bottom plate and a distal end of the bottom plate so that elastic deformation of the bottom plate is facilitated.

The openings and the elastic deformation assisting holes may be formed on both sides of the bottom plate so as to be symmetrical with regard to each other based on a center line of the bottom plate in a length direction thereof.

The bottom plate may have at least one support protrusion formed thereon in order to provide an installation position for the piezoelectric element.

The elastic member may further include extension plates extended from both side surfaces of a central portion of the bottom plate.

The extension plates may include support plate parts contacting front and rear surfaces of the mass body, respectively, and connection parts coupling the support plate parts and the bottom plate to each other.

The support plate parts may have one or more support jaws extended therefrom in order to support the lower surface of the mass body. The supporting jaws may be inserted into support jaw insertion grooves formed on the lower surface of the mass body.

The vibration generating apparatus may further include a buffering member installed on the other surface of the elastic member so as to be disposed below the piezoelectric element.

A lower case configuring the vibration transferring member may have at least one passage hole formed therein so that the buffering member passes therethrough when the elastic member vibrates.

The lower case may have one or more protrusion parts formed thereon in order to support both end portions of the elastic member.

The vibration generating apparatus may further include a circuit board connected to the piezoelectric element and installed on an upper surface of the elastic member.

The elastic member may have an opening formed therein in order to expose an electrode formed on a lower surface of the piezoelectric element externally. The circuit board may be provided with an insertion hole, into which the electrode of the piezoelectric element is inserted, and be provided with a piezoelectric element connection part inserted into the opening.

The circuit board may be provided with an external exposed part having power supply connection terminals formed thereon, disposed at one side of the piezoelectric element connection part, and bent.

The vibration generating apparatus may further include a damage preventing member installed on at least one of an upper surface of the piezoelectric element and/or the lower surface of the mass body disposed so as to face the piezoelectric element and preventing damage to the piezoelectric element.

The damage preventing member may be formed of a material having elasticity.

The vibration transferring member may include a lower case having a plate shape and an upper case coupled to the lower case and having an internal space.

The vibration generating apparatus may further include one or more damper members installed on an inner surface of the upper case, wherein the damper members are inserted into damper member insertion grooves formed on an upper surface of the mass body when the elastic member vibrates.

The mass body may have a curved surface formed on the lower surface thereof, wherein the curved surface is curved from the step part of the mass body toward a distal end of the mass body.

The curved surface may have a curvature equal to or larger than that of the elastic member in the state in which the elastic member is maximally deformed at the time of being deformed downwardly.

According to some embodiments of the present disclosure, a vibration generating apparatus may include a vibration transferring member transferring vibrations to outside the vibration generating apparatus, an elastic member having one or more end portions fixed to the vibration transferring member, a mass body vibrating together with the elastic member when the elastic member vibrates, a piezoelectric element installed on one surface of the elastic member so as to be disposed to face the mass body, a circuit board connected to the piezoelectric element and installed on an upper surface of the elastic member, and a damage preventing member installed on at least one of an upper surface of the piezoelectric element or a lower surface of the mass body disposed so as to face the piezoelectric element and preventing damage to the piezoelectric element. The elastic member may have an opening formed therein in order to expose an electrode formed on a lower surface of the piezoelectric element. The circuit board may be provided with a piezoelectric element connection part inserted into the opening. The piezoelectric element may be disposed on the piezoelectric element connection part of the circuit board in the opening.

The circuit board may be provided with an external exposed part having one or more power supply connection terminals formed thereon, disposed at one side of the piezoelectric element connection part, and bent.

The damage preventing member may be formed of a material having elasticity.

According to some embodiments of the present disclosure, a vibration generating apparatus may include a vibration transferring member transferring vibrations to outside of the vibration generating apparatus, an elastic member having one or more end portions fixed to the vibration transferring member, a mass body vibrating in response to vibrations of the elastic member when the elastic member vibrates, and a piezoelectric element installed on one surface of the elastic member. The elastic member may include a bottom plate having end portions fixed to the vibration transferring member. The bottom plate may have at least one support protrusion formed thereon in order to support both end portions and both side surfaces of the piezoelectric element.

The bottom plate may have one or more openings formed therein in order to expose an electrode formed on the piezoelectric element. The number of support protrusions may be plural. At least two of support protrusions may be disposed at both end portions of the openings.

According to some embodiments of the present disclosure, a vibration generating apparatus may include a vibration transferring member transferring vibrations to outside the vibration generating apparatus, an elastic member having one or more end portions fixed to the vibration transferring member, a mass body vibrating in response to vibrations of the elastic member, and a piezoelectric element installed on one surface of the elastic member so as to be disposed to face the mass body.

According to some embodiments of the present disclosure, a vibration generating apparatus may include a vibration transferring member transferring vibrations externally, an elastic member having one or more end portions fixed to the vibration transferring member, a mass body vibrating in response to vibrations of the elastic member, and piezoelectric elements installed on both surfaces of the elastic member, any one of the piezoelectric elements being disposed so as to face the mass body. The mass body may have one or more step parts formed in a lower surface thereof in order to prevent contact between the mass body and the piezoelectric element. The lower surface of the mass body in which the step parts are formed and the piezoelectric element may be disposed so as to be spaced apart from each other by a predetermined distance.

According to some embodiments, a vibration generating apparatus may comprise a mass body, an elastic member coupled to the mass body, and a piezoelectric element disposed on one surface of the elastic member facing the mass body. A surface of the mass body facing the piezoelectric element may have a shape that prevents contact between the piezoelectric element and the mass body.

The surface of the mass body may have one or more stepped parts formed to correspond to the piezoelectric element.

The surface of the mass body may comprise an inclined surface from the stepped part toward a distal end of the mass body.

The elastic member may comprise a bottom plate, and support plate parts extending vertically from the bottom plate and supporting the mass body. The piezoelectric element may be installed on a surface of the bottom plate facing the mass body.

The vibration generating apparatus further comprise a case transferring vibrations to outside the vibration generating apparatus and coupled with the elastic member.

The vibration generating apparatus may further comprise one or more damper members attached on an inner surface of the case.

The vibration generating apparatus may further comprise one or more damage preventing members disposed on a surface of the piezoelectric element facing the mass body.

The vibration generating apparatus may further comprise one or more buffering members attached on another surface of the elastic member.

The case may have at least one opening through which the buffering members are moveable.

An inner surface of the case may comprise one or more protrusions supporting end portions of the elastic member.

The vibration generating apparatus may further comprise a circuit board connected to the piezoelectric element and disposed on the one surface of the elastic member.

The electric member may comprise one or more openings exposing an electrode formed on a surface of the piezoelectric element. The circuit board may comprise an insertion hole, into which the electrode is inserted, and a piezoelectric element connection part inserted into the openings.

The circuit board may comprise an external part extended to outside of the case and having a power supply connection terminal.

The elastic member may have one or more holes.

The surface of the mass body may comprise a curved surface between the stepped part and a distal end of the mass body.

BRIEF DESCRIPTION OF DRAWINGS

Embodiments of the present disclosure will be more clearly understood from the following description taken in conjunction with the accompanying drawings, in which:

FIG. 10 is a schematic cross-sectional view showing a vibration generating apparatus according to another exemplary embodiment of the present disclosure.

DETAILED DESCRIPTION

Figure 1:
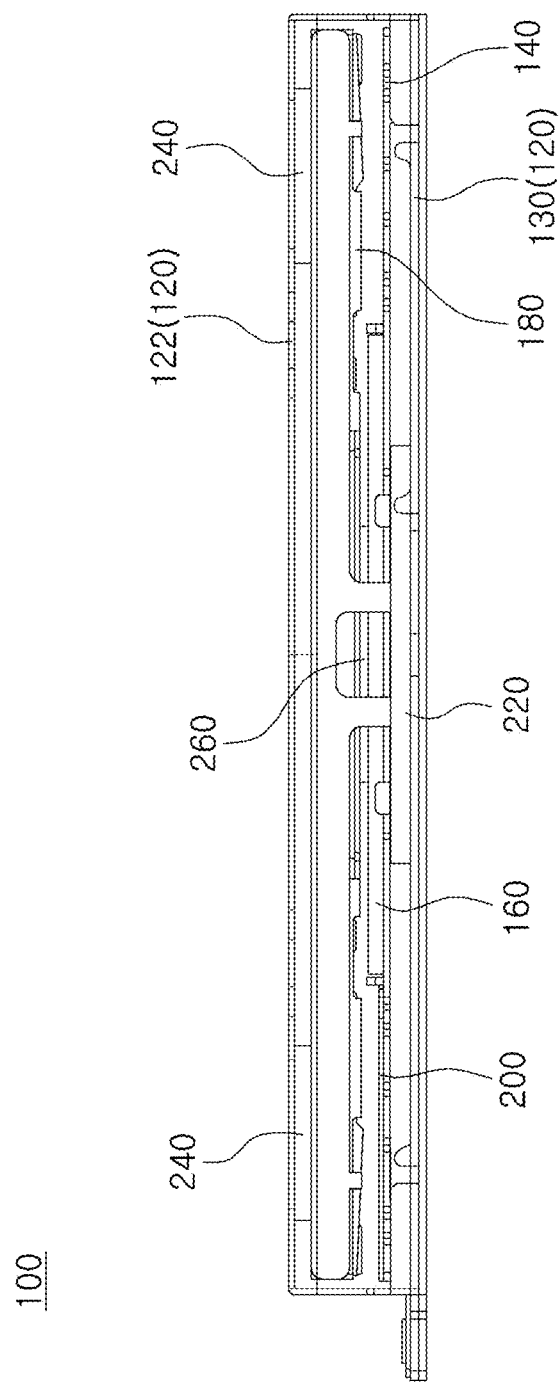
FIG. 1 is a schematic cross-sectional view showing a vibration generating apparatus according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided to explain the principles of the invention and its practical applications, thereby enabling others skilled in the art to understand the invention for various embodiments and with various modifications as are suited to the particular use contemplated. In the drawings, the shapes and dimensions of elements may be exaggerated for clarity, and the same reference numerals will be used throughout to designate the same or like elements. It will also be understood that, although the terms first, second, etc. may be used herein to describe various elements, these elements should not be limited by these terms. These terms are only used to distinguish one element from another. As used in this description and the appended claims, the singular forms "a", "an" and "the" are intended to include the plural forms as well, unless the context clearly indicates otherwise.

Figure 2:
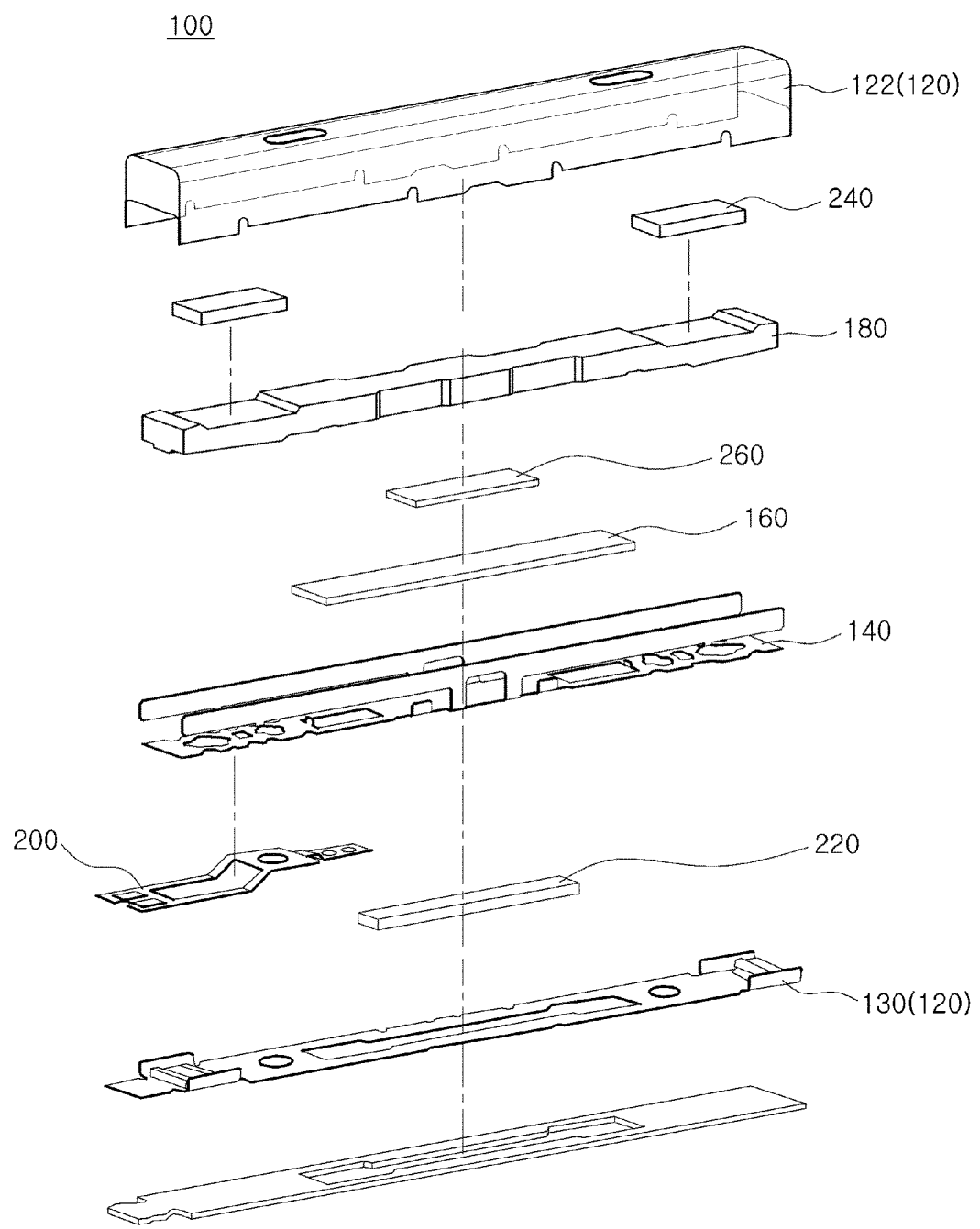
FIG. 2 is an exploded perspective view showing the vibration generating apparatus according to an exemplary embodiment of the present disclosure.

FIG. 1 is a schematic cross-sectional view showing a vibration generating apparatus according to an exemplary embodiment of the present disclosure. FIG. 2 is an exploded perspective view showing the vibration generating apparatus according to an exemplary embodiment of the present disclosure.

Referring to FIGS. 1 and 2, a vibration generating apparatus 100 according to an exemplary embodiment of the present disclosure may include a vibration transferring member 120, an elastic member 140, a piezoelectric element 160, a mass body 180, a circuit board 200, a buffering member 220, a damper member 240, and a damage preventing member 260 by way of example.

Terms with respect to directions are defined below. As viewed in FIG. 3, a length direction refers to an X direction and a width direction refers to a Y direction. In addition, a height direction refers to a Z direction. The terms defined above are used below, having the same meaning as the defined meaning. That is, in describing the respective components, the terms described above indicate the same directions as the defined directions.

The vibration transferring member 120 may be configured to transfer vibrations externally and may have, for example, but not limited to, a rectangular parallelepiped shape. In addition, the vibration transferring member 120 may include an upper case 122 and a lower case 130. For example, the upper case 122 may have a box shape which has an internal space, and the lower case 130 may have a plate shape.

Figure 3:
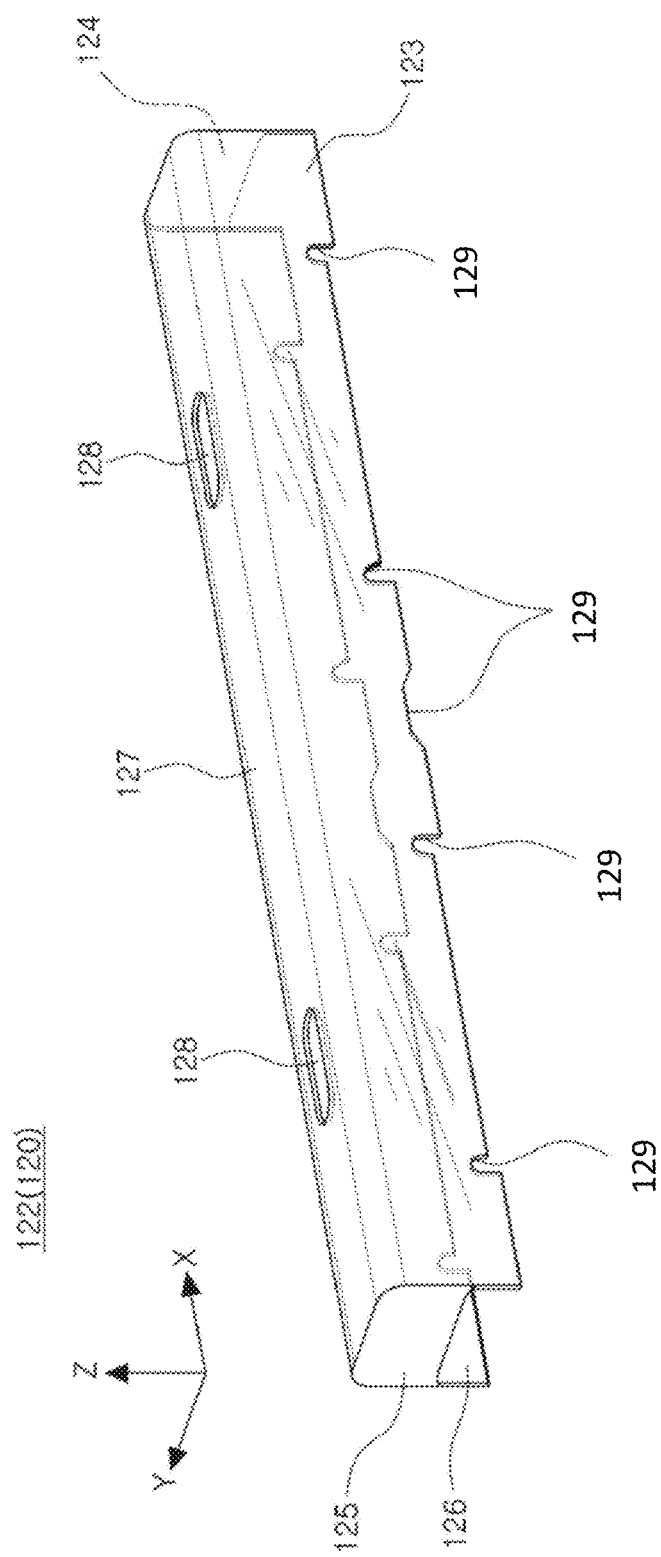
FIG. 3 is a perspective view showing an upper case included in the vibration generating apparatus according to an exemplary embodiment of the present disclosure.

FIG. 3 is a perspective view showing an upper case included in the vibration generating apparatus according to an exemplary embodiment of the present disclosure.

Referring to FIGS. 1 through 3, the upper case 122 of the vibration transferring member 120 may have a box shape, but a lower portion of the upper case 122 may be opened. The upper case 122 may include a front plate 123, side plates 124 and 125, a rear plate 126, and an upper plate 127. The height of at least one of side plates 124 and 125 may be shorter than that of the front plate 123 and the rear plate 126 in a height direction to form an opening.

The circuit board 200 may be exposed outside the vibration transferring member 120 through the opening formed at an end portion of the upper case 122.

The front plate 123 and/or the rear plate 126 may have a single or a plurality of grooves 129 formed therein in order to allow the upper case 122 to be fixedly coupled to the lower case 130.

The upper plate 126 may have vent holes 128 formed therein in order to allow air to flow to an inner portion or an outer portion of the vibration transferring member 120 when the elastic member 140 vibrates.

Figure 4:
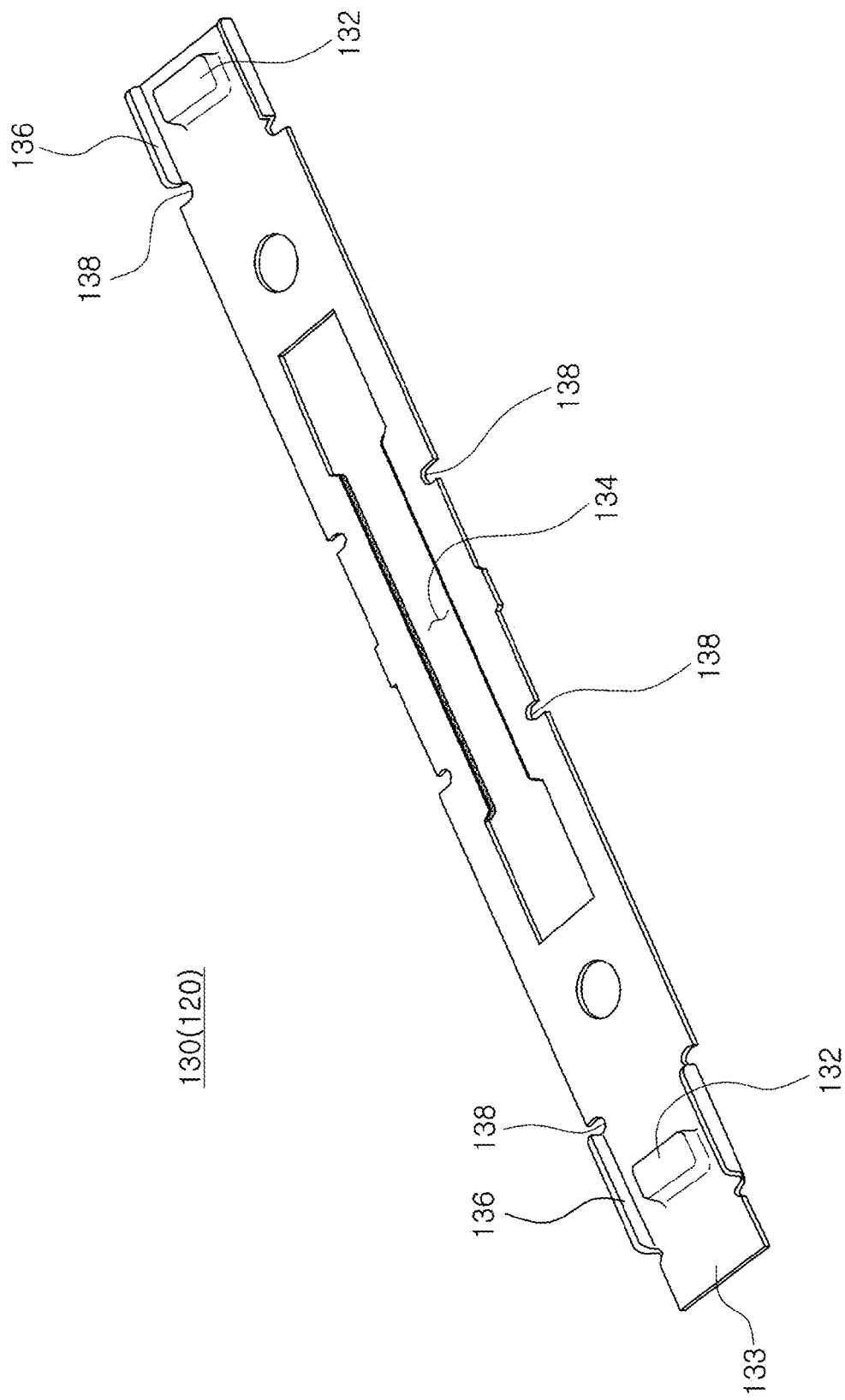
FIG. 4 is a perspective view showing a lowercase included in the vibration generating apparatus according to an exemplary embodiment of the present disclosure.

FIG. 4 is a perspective view showing a lower case included in the vibration generating apparatus according to an exemplary embodiment of the present disclosure.

Referring to FIGS. 1 through 4, the lower case 130 may have a plate shape. The lower case 130 may have protrusion parts 132 formed on or near both end portions thereof, respectively, in order to support both end portions of the elastic member 140. For instance, the protrusion part 132 may be formed by indenting and have a rectangular pillar shape.

At least one of both end portions of the lower case 130 may be provided with an extension plate 133 extended so as to protrude from the upper case 122 in the length direction thereof. The extension plate 133 may provide a seating surface for an exposed portion of the circuit board 200.

In addition, the lower case 130 may have a passage hole 134 formed in a central portion thereof so that the buffering member 220 may pass therethrough. The passage hole 134 may serve as a movement path through which the buffering member 220 installed on the elastic member 140 descends downwardly of the lower case 130 when the elastic member 140 vibrates. Therefore, a displacement amount of the elastic member 140 may be increased.

In addition, the passage hole 134 may have various shapes depending on a shape of the buffering member 220.

The lower case 130 may have coupling wall parts 136 formed in order to increase coupling force between the lower case 130 and the upper case 122. Outer surfaces of the coupling wall parts 136 may contact inner surfaces of the front plate 123 and the rear plate 126 to be configured to increase contact area between the upper case 122 and the lower case 130 when the upper case 122 and the lower case 130 are coupled to each other.

In addition, the lower case 130 may have grooves 138 formed therein so as to correspond to the plurality of grooves 129 formed in the upper case 122. The grooves 138 of the lower case 130 and the grooves 129 of the upper case 122, which are to facilitate assembling between the lower case 130 and the upper case 122, may not be formed in the lower case 130 and the upper case 122.

Figure 5:
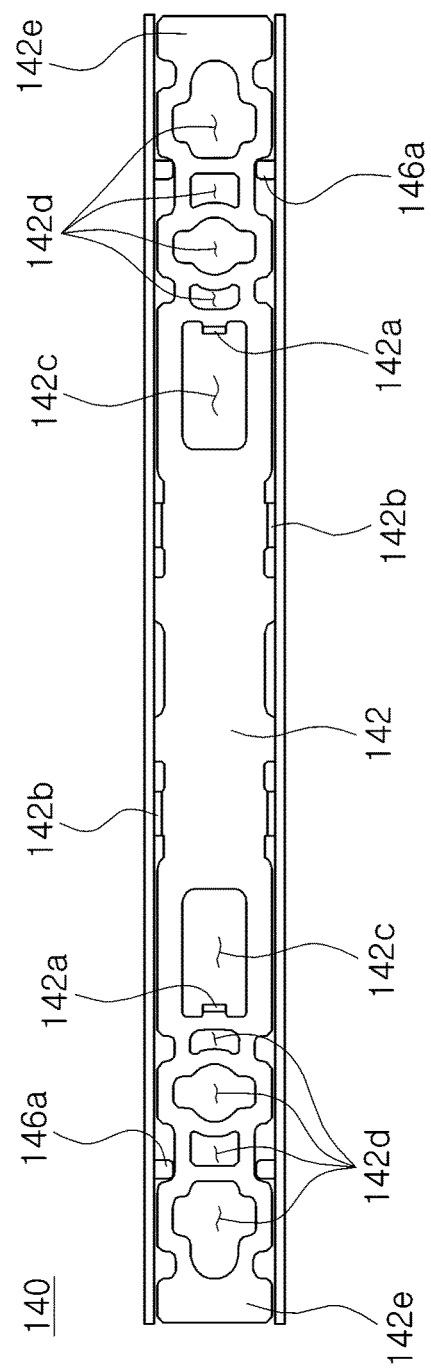
FIG. 5 is a plan view showing an elastic member included in the vibration generating apparatus according to an exemplary embodiment of the present disclosure.
Figure 6:
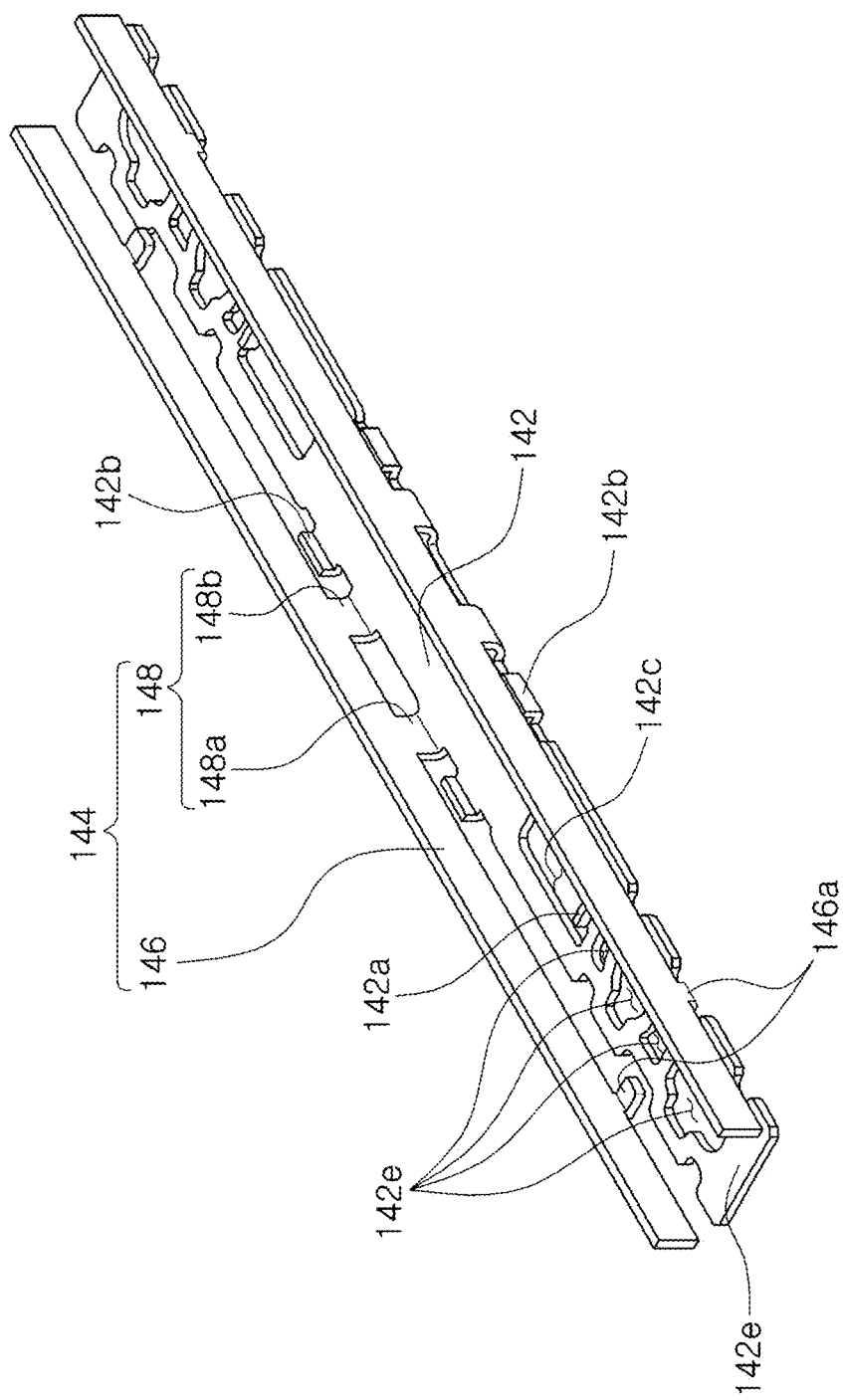
FIG. 6 is a perspective view showing the elastic member included in the vibration generating apparatus according to an exemplary embodiment of the present disclosure.

FIG. 5 is a plan view showing an elastic member included in the vibration generating apparatus according to an exemplary embodiment of the present disclosure. FIG. 6 is a perspective view showing the elastic member included in the vibration generating apparatus according to an exemplary embodiment of the present disclosure.

Referring to FIGS. 1 through 6, the elastic member 140 may have end portions fixed to the vibration transferring member 120. For example, the elastic member 140 may be fixed to the protrusion parts 132 of the lower case 130. Therefore, the elastic member 140 may have fixed ends at both end portions thereof, respectively. Although the elastic member 140 is fixed to the lower case 130 by way of example in an exemplary embodiment of the present disclosure, the present disclosure is not limited thereto. The elastic member 140 may be installed in the upper case 122.

In addition, the elastic member 140 may be installed in the vibration transferring member 120 so that both end portions of the elastic member 140 are interposed between the upper case 122 and the lower case 130.

The elastic member 140 may include a bottom plate 142 and extension plates 144, as shown in FIGS. 5 and 6. The bottom plate 142 may include a plurality of support protrusions 142a and 142b for installing the piezoelectric element 160 on the elastic member 140.

Two support protrusions 142a may support both side surfaces of the piezoelectric element 160, and the other support protrusions 142b may support other two side surfaces (front and rear surfaces) of the piezoelectric element 160.

Therefore, the piezoelectric element 160 may be installed at a predetermined position, and coupling force between the bottom plate 142 and the piezoelectric element 160 may be increased to facilitate elastic deformation of the bottom plate 142 at the time of deformation of the piezoelectric element 160.

Further, the coupling force between the bottom plate 142 and the piezoelectric element 160 may be increased by the support protrusions 142a and 142b to prevent the piezoelectric element 160 from being separated from the bottom plate 142.

In addition, the support protrusions 142a and 142b may serve to amplify a deformation amount of the piezoelectric element 160 at the time of the deformation of the piezoelectric element 160. For example, the support protrusions 142a and 142b may support both end portions and both side surfaces of the piezoelectric element 160, thereby increasing efficiency in transferring a deformation amount to the bottom plate 142 at the time of the deformation of the piezoelectric element 160.

The bottom plate 142 may have openings 142c formed therein in order to electrically connect the circuit board 200 and the piezoelectric element 160 to each other. The openings 142c may be formed in the bottom plate 142 so that both end portions of a lower surface of the piezoelectric element 160 may be exposed at the time of installing the piezoelectric element 160. That is, at the time of installing the piezoelectric element 160, a central portion of the lower surface of the piezoelectric element 160 may be supported by the bottom plate 142, and both end portions of the lower surface of the piezoelectric element 160 may be exposed to the opening 142c.

A single or a plurality of elastic deformation assisting holes 142d may be formed between the openings 142c and end portions of the bottom plate 142 in order to decease rigidity of the bottom plate 142 so that elastic deformation of the bottom plate 142 is facilitated. That is, the number of elastic deformation assisting holes 142d, holes formed in order to facilitate elastic deformation of regions adjacent to both end portions of the bottom plate 142, may be provided in plural, and have various shapes.

The bottom plate 142 may have support parts 142e formed at both end portions thereof, respectively. The support parts 142 may be supported by the protrusion parts 132 of the lower case 130, respectively.

The extension plates 144 may include support plate parts 146 contacting a front surface and a rear surface of the mass body 180, respectively, and connection parts 148 connecting the support plate parts 146 and the bottom plate 142 to each other, respectively, and/or supporting the mass body 180 as shown in FIG. 6.

The connection parts 148 may be extended from front and rear surfaces of the bottom plate 142, respectively. In addition, the connection part 148 may include first and second connection parts 148a and 148b disposed so as to be spaced apart from each other by a predetermined distance in the length direction.

The connection part 148 may include the first and second connection parts 148a and 148b, such that the support plate part 146 and the bottom plate 142 may be more firmly connected to each other.

The support plate parts 146 may be extended in a length direction of the mass body 180 and may have inner surfaces contacting the front and rear surface of the mass body 180, respectively and or supporting the mass body 180. For example, the support plate part 146 may have a length equal to or longer than that of the mass body 180. The support plate part 146 may have a shape approximately corresponding to that of the mass body 180.

The support plate part 146 may be provided with support jaws 146a for supporting a lower surface of the mass body 180. The support jaws 146a may be disposed so as to be spaced apart from each other by a predetermined distance in a length direction of the support plate part 146. For example, the support jaws 146a may be disposed so as to be adjacent to both end portions of the mass body 180, respectively.

A position of the mass body 180 in a height direction may be controlled by the support jaws 146a. For example, the mass body 180 may be disposed so as to be spaced apart from the bottom plate 142 of the elastic member 140 by a predetermined distance by the support jaws 146a.

Figure 7:
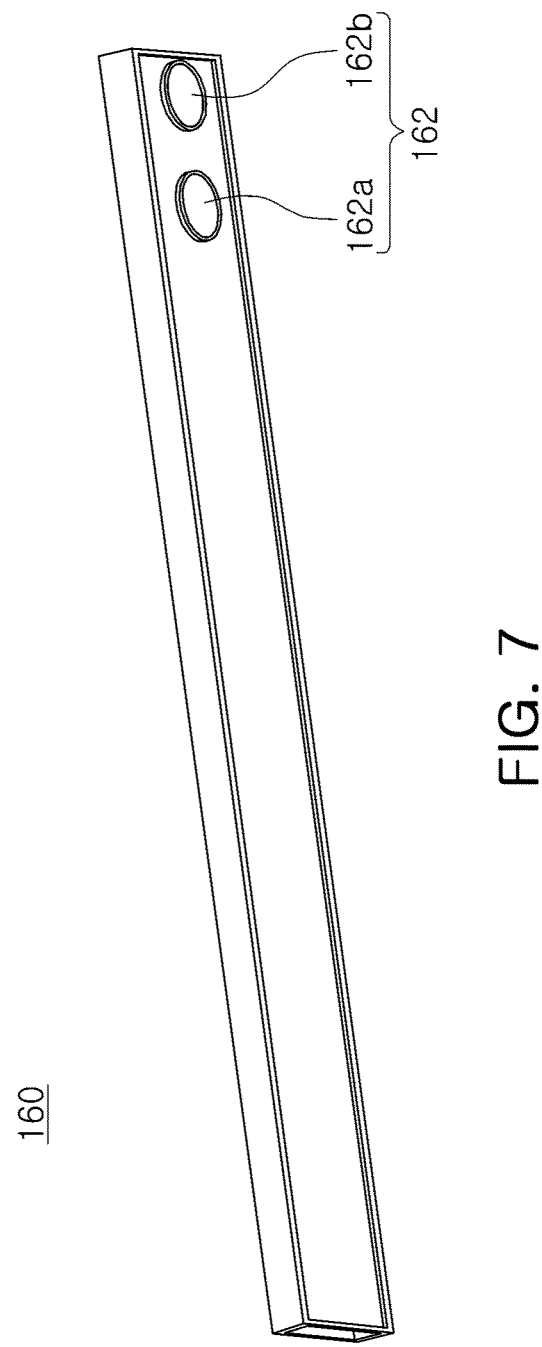
FIG. 7 is a bottom perspective view showing a piezoelectric element included in the vibration generating apparatus according to an exemplary embodiment of the present disclosure.

FIG. 7 is a bottom perspective view showing a piezoelectric element included in the vibration generating apparatus according to an exemplary embodiment of the present disclosure.

Referring to FIGS. 1 through 7, the piezoelectric element 160 may be installed on one surface of the elastic member 140 so as to be disposed to face the mass body 180. For example, the piezoelectric element 160 may be fixedly installed on an upper surface of the bottom plate 142 so as to be disposed between the lower surface of the mass body 180 and the bottom plate 142 of the elastic member 140.

The piezoelectric element 160 may have, for example, but not limited to, a rectangular parallelepiped shape as shown in FIG. 7. One end portion of the lower surface of the piezoelectric element 160 may be provided with an electrode 162. The electrode 162 may protrude from the lower surface of the piezoelectric element 160 and have a positive (+) electrode 162a and a negative (−) electrode 162b.

In the case in which the piezoelectric element 160 is installed on the bottom plate 142 of the elastic member 140, both side surfaces of the piezoelectric element 160 may be supported by two first support protrusions 142a, and the front and rear surfaces of the piezoelectric element 160 may be supported by two support protrusions 142b.

In addition, in the case in which the piezoelectric element 160 is installed on the bottom plate 142, the electrode 162 described above may be inserted into the opening 142c of the bottom plate 142.

Further, in the case in which the piezoelectric element 160 is installed on the bottom plate 142, the piezoelectric element 160 may be disposed so as to be spaced apart from the lower surface of the mass body 180 by a predetermined distance.

Figure 8:
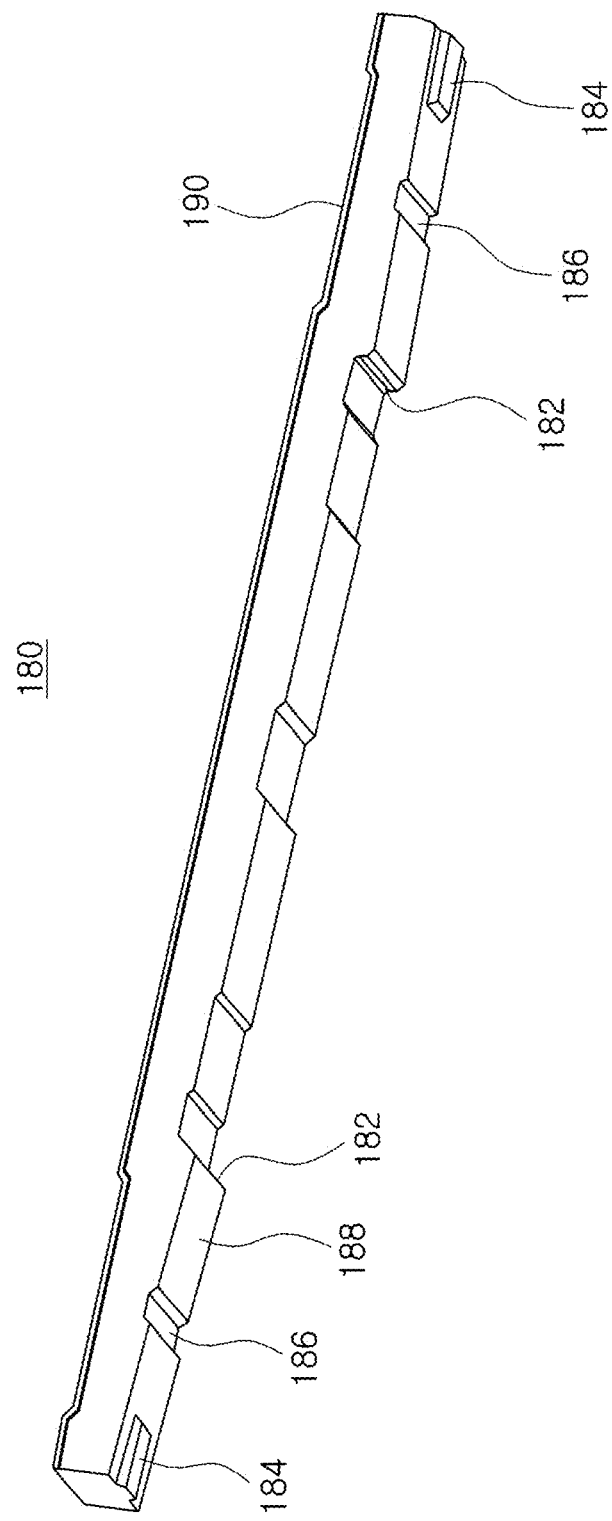
FIG. 8 is a perspective view showing amass body included in the vibration generating apparatus according to an exemplary embodiment of the present disclosure.

FIG. 8 is a perspective view showing a mass body included in the vibration generating apparatus according to an exemplary embodiment of the present disclosure.

Referring to FIGS. 1 through 8, the mass body 180 may vibrate together with the elastic member 140 when the elastic member 140 vibrates. The mass body 180 may have, for instance, a bar shape, and may have step parts 182 formed on a lower surface thereof in order to prevent contact between the mass body 180 and the piezoelectric element 160.

In addition, the lower surface of the mass body 180 on which the step parts 182 are formed may be disposed so as to be spaced apart from the piezoelectric element 160 by a predetermined distance. The mass body 180 may be provided with the step parts 182 in order to prevent contact between the piezoelectric element 160 and the mass body 180 when the bottom plate 142 of the elastic member 140 is elastically deformed in response to expansion and contraction of the piezoelectric element 160. Therefore, even at the time of elastic deformation of the bottom plate 142, the piezoelectric element 160 and the mass body 180 may not contact each other.

The step part 182 may have a single or a plurality of steps.

The mass body 180 may have stopper parts 184 formed at both end portions of the lower surface thereof in order to limit displacement of the mass body 180 at the time of the elastic deformation of the elastic member 140. That is, the stopper parts 184 may contact the end portions of the bottom plate 142 of the elastic member 140 to limit the displacement of the mass body 180. Therefore, contact between the mass body 180 and the bottom plate 142 in inner regions of both end portions of the bottom plate 142 may be prevented.

For example, the stopper parts 184 may contact the end portions of the bottom plate 142 of the elastic member 140 at the time of the elastic deformation of the elastic member 140 or at the time external impacts applied to the vibration generating apparatus, such that the mass body 180 cannot descend downwardly below a predetermined level. Therefore, contact between the mass body 180 and the piezoelectric element 160 may be prevented.

Support jaw insertion grooves 186 may be formed on the mass body 180 so as to be disposed between the stopper parts 184 and the step parts 182 of the mass body 180, respectively. The mass body 180 may be installed on the elastic member 160 so that the support jaws 146a of the elastic member 140 are inserted into the support jaw insertion grooves 186, respectively. In addition, the position of the mass body 180 in the height direction may be controlled by the support jaws 146a.

Further, the mass body 180 may have an inclined surface 188 formed from the step part 182 thereof on the lower surface thereof. The inclined surface 188 may have a gradient so as to prevent contact with the bottom plate 142 at the time of the elastic deformation of the elastic member 140. For example, the inclined surface 188 may have a gradient equal to or smaller than that of an absolute value of the bottom plate 142 in a shape in which the bottom plate 142 is maximally deformed at the time of being elastically deformed.

Although the case in which the inclined surface 188 is inclined is shown in FIG. 8 and described by way of example in an exemplary embodiment of the present disclosure, the present disclosure is not limited thereto. For example, the mass body 180 may have a curved surface formed on the lower surface thereof. The curved surface is curved from the step part 182 of the mass body 180 toward a distal end thereof.

The curved surface may have a curvature equal to or larger than that of the elastic member 140 in the state in which the elastic member 140 is maximally deformed at the time of being deformed downwardly.

Further, the mass body 180 may have damper member insertion grooves 190 formed on an upper surface thereof. The damper member insertion grooves 190 may be disposed below the damper members 240 and have the damper members 240 inserted thereinto when the elastic member 140 vibrates.

Figure 9:
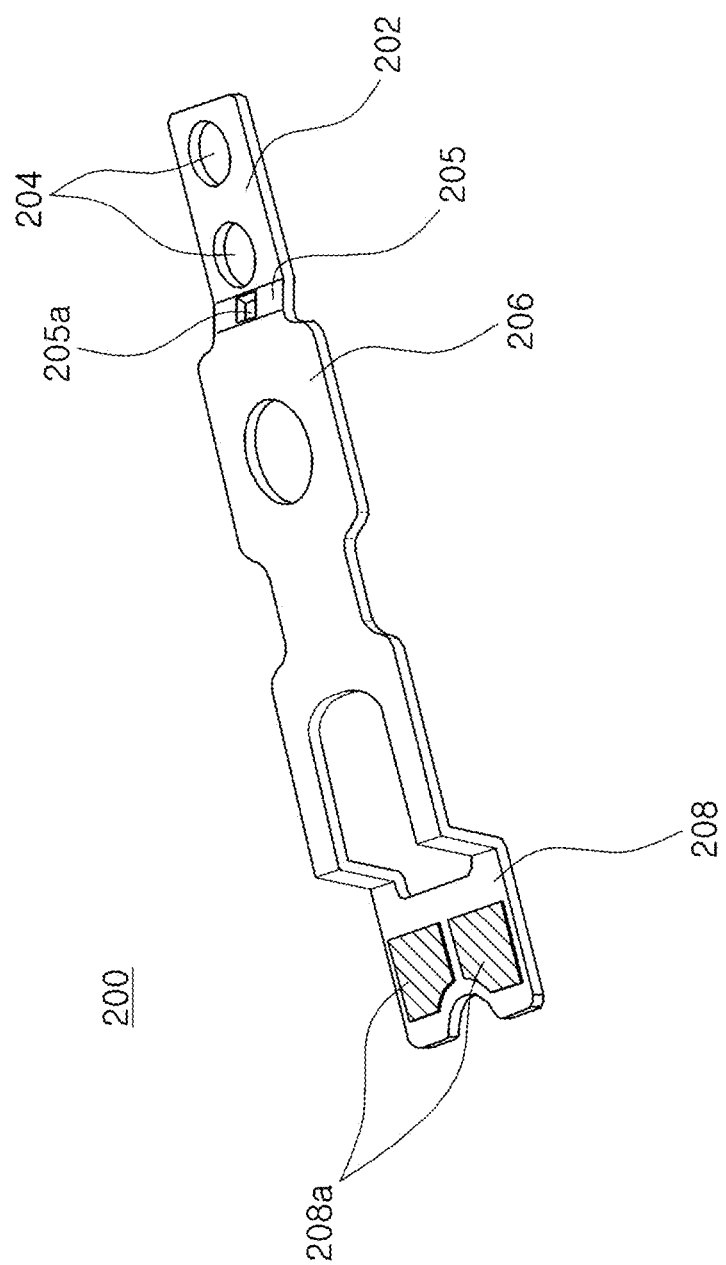
FIG. 9 is a perspective view showing a circuit board included in the vibration generating apparatus according to an exemplary embodiment of the present disclosure.

FIG. 9 is a perspective view showing a circuit board included in the vibration generating apparatus according to an exemplary embodiment of the present disclosure.

Referring to FIGS. 2 and 9, the circuit board 200 may be connected to the piezoelectric element 160 and vibrate together with the elastic member 140. The circuit board 200 may be provided with a piezoelectric element connection part 202. The piezoelectric element connection part 202 may have insertion holes 204 into which the electrodes 162 of the piezoelectric element 160 are inserted.

The piezoelectric element connection part 202 may be inserted into the opening 142c shown in FIG. 5 formed in the bottom plate 142 of the elastic member 140.

Therefore, a solder for connecting the piezoelectric element 160 and the circuit board 200 to each other may be disposed in the opening 142c of the bottom plate 142, such that an increase in a thickness due to the solder may be suppressed.

The piezoelectric element connection part 202 may be formed to be stepped with respect to a body 206 of the circuit board 200. The piezoelectric element connection part 202 and the body 206 may be connected to each other by an inclined part 205.

The inclined part 205 may be provided with a support protrusion insertion hole 205a into which the support protrusion 142a shown in FIG. 5 of the bottom plate 142 is inserted.

The body 206 may have a plurality of holes and/or grooves formed therein so as to smoothly vibrate together with the bottom plate 142.

The circuit board 200 may be provided with an external exposed part 208 having power supply connection terminals 208a formed thereon and exposed outside the upper case 122. The external exposed part 208 may be formed to be stepped with respect to the body 206.

A scheme of assembling the circuit board 200 is schematically described. The circuit board 200 may be installed on the upper surface of the bottom plate 142 of the elastic member 140. For example, the body 206 may be installed on the upper surface of the bottom plate 142, and the inclined part 205 and the piezoelectric element connection part 202 extended from one end of the body 206 may be inserted into the opening 142c formed in the bottom plate 142.

Here, the inclined part 205 and the piezoelectric element connection part 202 may be disposed at a predetermined position by the support protrusion 142a of the bottom plate 142. The piezoelectric element connection part 202 inserted into the opening 142c may be disposed below the piezoelectric element 160.

The external exposed part 208 extended from the other end of the body 206 may be exposed outside the upper case 122 through the opening disposed below the side plate 125 of the upper case 122.

The external exposed part 208 may be seated on the extension plate 133 of the lower case 130.

Referring to FIGS. 1 and 2, the buffering member 220 may be fixedly installed on the lower surface of the elastic member 140. For instance, the buffering member 220 may be installed on a lower surface of the bottom plate 142 of the elastic member 140 to thereby vibrate together with the bottom plate 142.

The buffering member 220 may descend downwardly of the lower case 130 while passing through the lower case 130 via the passage hole 134 formed in the lower case 130 when the elastic member 140 vibrates.

The buffering member 220 may not be subjected to interference of vibrations by the lower case 130, such that a displacement amount of the elastic member 140 may be increased.

The damper member 240 may be fixedly installed on a lower surface of the upper plate 126 of the case 122 and be disposed on the damper member insertion groove 190 of the mass body 180. The damper member 240 may, for example, decrease noise generated due to contact between the mass body 180 and the upper case 122 and prevent damage to the upper case 122 and/or the mass body 180.

The damage preventing member 260 may be installed on an upper surface of the piezoelectric element 160 to prevent damage to the piezoelectric element 160. For example, the damage preventing member 260 may be formed of a tape attached to the upper surface of the piezoelectric element 160.

The buffering member 220, the damper member 240, and/or the damage preventing member 260 described above may not be included in the vibration generating apparatus 100.

For instance, since the piezoelectric element 160 may be installed on the upper surface of the bottom plate 142 of the elastic member 140, damage to the piezoelectric element 160 may be prevented when external impacts are applied to the vibration generating apparatus. Further, since contact between the piezoelectric element 160 and the lower case 130 may be prevented, generation of noise may be decreased. Additionally, space utilization of a lower region in an internal space of the vibration transferring member 120 divided by the elastic member 140 may be improved. The vibration generating apparatus 100 may be further thinned.

As the piezoelectric element connection part 202 of the circuit board 200 is installed into the opening 142c formed in the bottom plate 142 of the elastic member 140, an increase in a thickness due to the solder for connecting the circuit board 200 and the piezoelectric element 160 to each other may be prevented.

In addition, since the buffering member 220 may descend downwardly of the lower case 130 by passing the passage hole 134 of the lower case 130, thinness of the vibration generating apparatus 100 may be implemented.

As described above, the piezoelectric element 160 may be installed on the upper surface of the elastic member 140, such that the piezoelectric element 160 and the lower case 130 may not contact each other when the external impacts are applied to the vibration generating apparatus, whereby the damage to the piezoelectric element 160 may be prevented.

In addition, the step part 182 for preventing contact between the mass body 180 and the piezoelectric element 160 may be formed in the mass body 180, whereby the damage to the piezoelectric element 160 may be prevented.

Further, the inclined surface 188 having a gradient corresponding to a shape of the elastic member 140 when the elastic member 140 is maximally deformed may be formed on the lower surface of the mass body 180, whereby the generation of the noise due to the contact between the mass body 180 and the elastic member 140 may be prevented.

Further, the efficiency in transferring the deformation amount at the time of the deformation of the piezoelectric element 160 may be increased by the support protrusions 142a and 142b of the elastic member 140, and the coupling force between the piezoelectric element 160 and the elastic member 140 may be increased by the support protrusions 142a and 142b of the elastic member 140.

Hereinafter, a vibration generating apparatus according to another exemplary embodiment of the present disclosure will be described with reference to the accompanying drawings. However, a detailed description of the same components as the above-mentioned components will be omitted and be replaced by the above-mentioned description.

FIG. 10 is a schematic cross-sectional view showing a vibration generating apparatus according to another exemplary embodiment of the present disclosure.

Referring to FIG. 10, a vibration generating apparatus 300 according to another exemplary embodiment of the present disclosure may include a vibration transferring member 120, an elastic member 140, piezoelectric elements 360, a mass body 180, a circuit board 200, a buffering member 220, a damper member 240, and a damage preventing member 260 by way of example.

Since the vibration transferring member 120, the elastic member 140, the mass body 180, the circuit board 200, the buffering member 220, the damper member 240, and the damage preventing member 260 are the same as or similar with those of the vibration generating apparatus 100 according to an exemplary embodiment of the present disclosure described above, a detailed description thereof is omitted.

The piezoelectric elements 360 may be installed on both surfaces of the elastic member 140, and one of the piezoelectric elements 360 may be disposed so as to face the mass body 180. For example, the piezoelectric elements 360 may include a first piezoelectric element 362 installed on one surface of the elastic member 140 and a second piezoelectric element 364 installed on the other surface of the elastic member 140.

As described above, the piezoelectric elements 360 may include the first and second piezoelectric elements 362 and 364 installed on both surfaces of the elastic member 140, whereby a vibration amount may be increased.

The buffering member 220 may be fixedly installed on the second piezoelectric element 364 formed on the other surface of the elastic member 140.

The piezoelectric element 360 may be installed on the upper surface of the elastic member 140, such that the piezoelectric element 360 and the lower case 130 may not contact each other at the time of applying the external impact to the vibration generating apparatus, whereby the damage to the piezoelectric element 360 may be prevented.

In addition, the step part 182 for preventing the contact between the mass body 180 and the piezoelectric element 360 is formed on the mass body 180, whereby the damage to the piezoelectric element 360 may be prevented.

Further, the inclined surface 188 having the gradient corresponding to a shape of the elastic member 140 when the elastic member 140 is maximally deformed is formed on the lower surface of the mass body 180, whereby the generation of the noise due to the contact between the mass body 180 and the elastic member 140 may be prevented.

While exemplary embodiments have been shown and described above, it will be apparent to those skilled in the art that modifications and variations could be made without departing from the spirit and scope of the present disclosure as defined by the appended claims. Accordingly, the illustrative discussions above are not intended to be exhaustive or to limit the invention to the precise forms disclosed.

What is claimed is:

1. A vibration generating apparatus, comprising:
   a vibration transferring member transferring vibrations to outside the vibration generating apparatus;
   an elastic member having one or more end portions fixed to the vibration transferring member;
   a mass body vibrating in response to vibrations of the elastic member; and
   a piezoelectric element installed on one surface of the elastic member facing the mass body,
   wherein a lower surface of the mass body has step parts which are formed to prevent contact between the mass body and the piezoelectric element during the vibrations of the elastic member, and
   wherein the lower surface of the mass body and the piezoelectric element are disposed so as to be spaced apart from each other by a predetermined distance.

2. The vibration generating apparatus of claim 1, wherein the mass body has an inclined surface formed on the lower surface thereof, the inclined surface being inclined upwardly from the step part of the mass body toward a distal end of the mass body.

3. The vibration generating apparatus of claim 1, wherein the elastic member includes a bottom plate having both end portions fixed to the vibration transferring member.

4. The vibration generating apparatus of claim 3, wherein the bottom plate has one or more openings formed therein to expose an electrode formed on the piezoelectric element.

5. The vibration generating apparatus of claim 4, wherein the bottom plate has at least one elastic deformation assisting hole formed between the opening of the bottom plate and a distal end of the bottom plate.

6. The vibration generating apparatus of claim 5, wherein the openings and the elastic deformation assisting holes are formed symmetrically in the bottom plate.

7. The vibration generating apparatus of claim 3, wherein the bottom plate has at least one support protrusion formed thereon to provide an installation position for the piezoelectric element.

8. The vibration generating apparatus of claim 3, wherein the elastic member further comprises extension plates extended from side surfaces of a central portion of the bottom plate.

9. The vibration generating apparatus of claim 8, wherein the extension plates comprise:
   support plate parts supporting the mass body; and
   connection parts coupling the support plate parts and the bottom plate to each other.

10. The vibration generating apparatus of claim 9, wherein the support plate parts have one or more support jaws extended therefrom to support the lower surface of the mass body, the supporting jaws being inserted into support jaw insertion grooves formed on the lower surface of the mass body.

11. The vibration generating apparatus of claim 1, further comprising a buffering member installed on another surface of the elastic member and disposed below the piezoelectric element.

12. The vibration generating apparatus of claim 11, wherein the vibration transferring member comprises a lower case having at least one passage hole formed therein so that the buffering member passes therethrough when the elastic member vibrates.

13. The vibration generating apparatus of claim 12, wherein the lower case has one or more protrusion parts formed thereon and supporting the end portions of the elastic member.

14. The vibration generating apparatus of claim 1, further comprising a circuit board connected to the piezoelectric element and installed on an upper surface of the elastic member.

15. The vibration generating apparatus of claim 14, wherein:
   the elastic member has an opening formed therein and exposing an electrode formed on a lower surface of the piezoelectric element, and the circuit board is provided with an insertion hole, into which the electrode of the piezoelectric element is inserted, and a piezoelectric element connection part inserted into the opening.

16. The vibration generating apparatus of claim 15, wherein the circuit board is provided with an external exposed part having power supply connection terminals formed thereon, disposed at one side of the piezoelectric element connection part, and bent.

17. The vibration generating apparatus of claim 1, further comprising a damage preventing member installed on at least one of an upper surface of the piezoelectric element or the lower surface of the mass body and preventing damage to the piezoelectric element.

18. The vibration generating apparatus of claim 17, wherein the damage preventing member is formed of a material having elasticity.

19. The vibration generating apparatus of claim 1, wherein the vibration transferring member comprises a lower case having a plate shape and an upper case coupled to the lower case and having an internal space.

20. The vibration generating apparatus of claim 19, further comprising one or more damper members installed on an inner surface of the upper case, the damper members being inserted into damper member insertion grooves formed on an upper surface of the mass body when the elastic member vibrates.

21. The vibration generating apparatus of claim 1, wherein the mass body has a curved surface formed on the lower surface thereof, the curved surface being curved upwardly from the step part of the mass body toward a distal end of the mass body.

22. The vibration generating apparatus of claim 21, wherein the curved surface has a curvature equal to or larger than that of the elastic member in the state in which the elastic member is maximally deformed at the time of being deformed downwardly.

\* \* \* \* \*